United States Patent [19]
Srinivasan et al.

[11] Patent Number: 5,319,261
[45] Date of Patent: Jun. 7, 1994

[54] REPROGRAMMABLE INTERCONNECT ARCHITECTURE USING FEWER STORAGE CELLS THAN SWITCHES

[75] Inventors: Adi Srinivasan, Fremont; Hong Cai, Sunnyvale; Ta-Pen Guo, Cupertino, all of Calif.

[73] Assignee: Aptix Corporation, San Jose, Calif.

[21] Appl. No.: 922,337

[22] Filed: Jul. 30, 1992

[51] Int. Cl.$^5$ .................. H03K 19/173; H03K 19/094
[52] U.S. Cl. ............................ 307/465.1; 307/468; 340/825.91
[58] Field of Search ............ 307/465, 465.1, 468; 340/825.83, 825.89, 825.9, 825.91, 825.93; 365/72, 96, 163; 364/716

[56] References Cited

U.S. PATENT DOCUMENTS

| | | | |
|---|---|---|---|
| 3,852,723 | 12/1974 | Wu | 340/825.83 |
| 4,631,686 | 12/1986 | Ikawa et al. | 340/825.91 |
| 4,725,835 | 2/1988 | Schreiner et al. | 340/825.83 |
| 4,746,921 | 5/1988 | Hofmann | 340/825.91 |
| 4,758,745 | 7/1988 | Elgamal et al. | 307/465 |
| 4,771,284 | 9/1988 | Masleid et al. | 340/825.83 |
| 4,870,302 | 9/1989 | Freeman | 307/465 |
| 5,121,111 | 6/1992 | Trumpp et al. | 340/825.91 |

OTHER PUBLICATIONS

Shin et al., "A 5 Gb/s 16×16 Si-Bipolar Crosspoint Switch", 1992, pp. 228-229.

Carpenter et al., "A 146 Mb/s Time Space Switch Chip", Feb. 18, 1988, pp. 112-113.
Stuart K. Tewksbury, *Wafer-Level Integrated Systems: Implementation Issues*, 1989, pp. 334 et seq.

Primary Examiner—Edward P. Westin
Assistant Examiner—Richard Roseen
Attorney, Agent, or Firm—D'Alessandro, Frazzini & Ritchie

[57] ABSTRACT

A first user re-programmable interconnect architecture is provided wherein N switching elements are connected between selected interconnect conductors. The switching elements are controlled by M active storage elements, where $M<N$. A group of N switching elements are controlled by a group of M active storage elements, where $M<N$. The states of the M active storage elements are collectively decoded to identify the one of N switching elements to be turned on. A second user re-programmable interconnect architecture is provided wherein a group of N switching elements are connected between selected interconnect conductors and are partially selected by decoding the states of $m_1$ active storage elements. The group of N switching elements are also partially selected by decoding the states of $m_2$ active storage elements. The decoding is arranged such that t the states of $m_1$ and $m_2$ active storage elements each are decoded to provide a partial address to identify one of the N switching elements to be turned to its "on" state. The sum of $m_1$ and $m_2$ is less than N.

14 Claims, 9 Drawing Sheets

REPROGRAMMABLE INTERCONNECT ARCHITECTURE USING FEWER STORAGE CELLS THAN SWITCHES

BACKGROUND OF THE INVENTION

1. Field of the Invention

The present invention relates to user re-programmable interconnect architectures, which employ active devices as re-programmable interconnect elements whose programmed state is stored in an active storage element (typically a static RAM cell). More particularly, the present invention relates to such architectures employing fewer storage elements than reprogrammable interconnect elements and which employ decoding to activate individual interconnect paths.

2. The Prior Art

User-programmable interconnect integrated circuit architectures are known in the art. These architectures typically comprise a set of interconnect conductors in an integrated circuit which a user may programmably connect to one another by the use of programmable elements.

The prior art contains examples of such architectures using one-time programmable interconnect elements, such as antifuses. A typical example of an architecture employing one-time programmable antifuse elements is disclosed in U.S. Pat. No. 4,758,745. The prior art contains examples of such architectures using re-programmable interconnect elements, such as active switching devices, each of whose programmed state (i.e., "on" or "off") is stored in an associated active storage element (typically a static RAM cell). A typical example of such an architecture is disclosed in U.S. Pat. No. 4,870,302.

While prior art user re-programmable interconnect architectures have found application in a number of different devices, such as field-programmable gate array devices, they are inherently limited by the amount of area which must be taken up on the integrated circuit die to accommodate the active switching device, usually an N-channel pass transistor or a CMOS pass transistor pair, and its associated active storage element. Because of this area utilization necessary to accommodate the interconnect mechanism, the size of practically-realizable re-programmable interconnect architectures is limited.

Bipolar crosspoint switch implementations of such user-programmable interconnect integrated circuit architectures are known in the art. For example, H. Shin et al, *A 5Gb/s 16×16 Si-Bipolar Crosspoint Switch*, 1992 IEEE ISSCC, pp. 228-229, describe a bipolar n by n crosspoint switch which requires n n:1 multiplexers. While such circuits are practically implementable in bipolar technology for reasonably small values of n (i.e., about less than n=256), such crosspoint architectures implemented in CMOS technology are not practical, since they would occupy more chip area than a fully populated matrix with one or more RAM cells used to drive each switch in the matrix as described above. In addition, in the architecture described in the Shin et al. paper, the number of crosspoints is necessarily quadratic in the number of objects (i.e., I/O pins or logic cell inputs and outputs) being switched. This attribute of this architecture severely restricts the number of objects which may be interconnected using a single reasonably sized integrated circuit die.

Time/space switch programmable architectures, such as that disclosed in S. Carpenter et al., "*A 146 Mb/s Time Space Switch Chip*," 1988 IEEE ISSCC, pp. 112-113, are also known in the art. The number of RAM cells used in such architectures is at least twice the number of switches being used to pass or block data at any given time.

It is an object of the present invention to provide a user re-programmable interconnect architecture in which the active switching device and its associated active storage element occupy less die area than in previous re-programmable interconnect architectures.

It is a further object of the present invention to provide a user re-programmable interconnect architecture in which N switching elements may be controlled by fewer than N active storage elements.

BRIEF DESCRIPTION OF THE INVENTION

According to the present invention, a user re-programmable interconnect architecture is provided wherein N switching elements are connected between selected interconnect conductors. The switching elements are controlled by M active storage elements, where $M<N$. According to a first embodiment of the invention, a group of N switching elements are controlled by a group of M active storage elements, where $M<N$. The states of the M active storage elements are collectively decoded to identify the one of N switching elements to be turned on.

According to a second embodiment of the invention, a group of N switching elements are connected between selected interconnect conductors and are partially selected by the states of $m_1$ active storage elements. The group of N switching elements are also partially selected by the states of $m_2$ active storage elements. The statement $m_1+m_2<N$ is true. The states of $m_1$ and $m_2$ active storage elements each provide a partial address to identify one of the N switching elements to be turned to its "on" state.

By introducing very reasonable software routing constraints, a single active storage element may be used to control multiple switching elements in any of the embodiments of the present invention.

BRIEF DESCRIPTION OF THE DRAWINGS

FIG. 7b is a schematic diagram of an exemplary NOR-decode circuit for use in the decoder of FIG. 7a.

FIG. 7c is a schematic diagram of an exemplary NAND-decode circuit for use in the decoder of FIG. 7a.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

The term "user re-programmable interconnect element" is used herein with reference to a single N-Channel pass transistor. Those of ordinary skill in the art will recognize that other elements, including but not limited to, CMOS pass gates, P-Channel MOS transistors, and other switching elements considered by those of ordinary skill in the art to be equivalent user re-programmable interconnect elements are intended to be included herein. The term "active storage element" is used herein with reference to a static random access memory cell. Those of ordinary skill in the art will immediately recognize that other active storage elements may be used to perform the function disclosed herein. Such elements include, without limitation, DRAMs, EPROMs, EE-PROMs, NOVRAMs, etc.

Prior art re-programmable interconnect archiectures comprise a number (N) of re-programmable interconnect elements distributed among a set of metal interconnect conductor lines to permit the interconnection of groups of the metal interconnect conductor lines. The state of each interconnect element or switch ("on" or "off") is defined and maintained by the output of an associated active storage element, usually in the form of a static random access memory (SRAM) cell. Thus N SRAM cells are required to control N re-programmable interconnect elements. This permits any of $2^N$ "maps" (combinations of "on" and "off" switches) to be programmed.

In the case of programmable logic, the interconnect conductors and switches permit the connection of inputs/outputs of logic devices (e.g. boolean gates, multiplexers, latches) to each other and I/O pads. In the case of programmable interconnect, the interconnect conductors and switches connect external (to the chip) signals, as specified by the user, through I/O pads.

Figure 1:
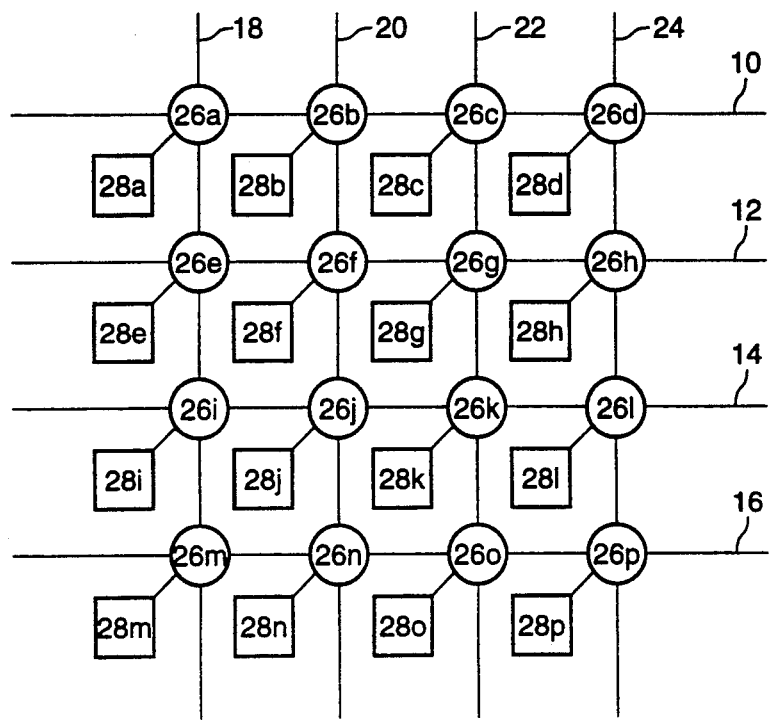
FIG. 1 is a schematic diagram of a typical prior-art user re-programmable interconnect architecture.

A typical prior-art re-programmable interconnect architecture is shown in FIG. 1. A plurality of horizontally-oriented interconnect conductors 10, 12, 14, and 16, usually in the form of metal lines in an integrated circuit or other microcircuit structure, are intersected by vertically-oriented interconnect conductors 18, 20, 22, and 24. A plurality of user re-programmable interconnect elements 26a-26p are connected between the horizontal and vertical interconnect conductors at the intersections. For example, user re-programmable interconnect element 26a is disposed at the intersection of horizontal interconnect conductor 10 and vertical interconnect conductor 18. Each user re-programmable interconnect element is a switching element which has two states. In a first "off" state, the interconnect conductors connected by the element remain electrically isolated from one another. In a second "on" state, the interconnect conductors are electrically connected together by a low-resistance path.

In the embodiment of FIG. 1, the intersections of horizontal and vertical interconnect conductors are 100% populated by user re-programmable interconnect elements, but those of ordinary skill in the art will recognize that the embodiment depicted in FIG. 1 is illustrative only and that actual implementations of such architecture may be less than 100% populated. Those of ordinary skill in the art will also recognize that, while FIG. 1 shows user re-programmable interconnect elements located at intersecting horizontal and vertical interconnect conductors, such user re-programmable interconnect elements may also be located at ends of segmented interconnect conductors to form longer conductor lengths, or between one of such conductors and another circuit element,. such as an I/O pad or the input or output of a circuit disposed on the integrated circuit substrate.

Each of user re-programmable interconnect elements 26a-26p has associated with it an active storage element 28a-28p, respectively. The active storage element controls the state of the user re-programmable interconnect element with which it is associated by providing an output signal which defines the state of the user re-programmable interconnect element. The prior art is characterized by provision of at least one active storage element per user re-programmable interconnect element.

Figure 2:
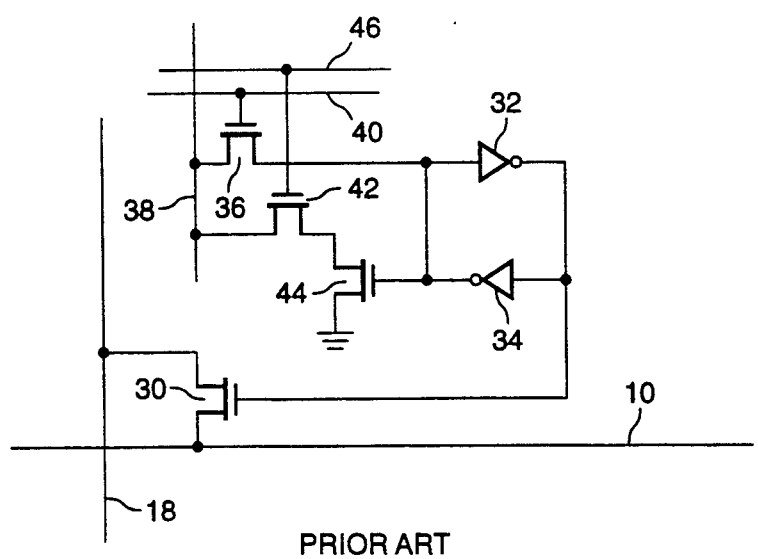
FIG. 2 is a schematic diagram of a typical switching element in combination with an active storage element as used in the prior-art user re-programmable interconnect architecture of FIG. 1.

Referring now to FIG. 2, a schematic diagram illustrates a user re-programmable interconnect element in combination with its active storage element driver circuit. N-Channel MOS transistor 30 comprises the user re-programmable interconnect element and is shown connected between horizontal interconnect conductor 10 and vertical interconnect conductor 18. The gate of N-Channel MOS transistor 30 acts to switch it between its "off" state and its "on" state.

In most architectures, the active storage element is located on the periphery of the integrated circuit, and connections are made to the gates of the switching transistors via metal lines in the integrated circuit. The active storage element comprises a static random-access memory cell including cross coupled inverters 32 and 34. The common node comprising the output of inverter 32 and the input of inverter 34 is the output node of the active storage element and drives the gate of N-Channel MOS transistor 30. An N-Channel MOS transistor 36 is connected between the common node comprising the output of inverter 34 and the input of inverter 32 and a bit line 38. The gate of N-Channel MOS transistor 36 is connected to a write word line 40. N-Channel MOS transistors 42 and 44 are connected in series between bit line 38 and ground. The gate of N-Channel MOS transistor 42 is connected to a read word line 46 and the gate of N-Channel MOS transistor 44 is connected to the common node comprising the output of inverter 34 and the input of inverter 32.

To read the state of the active storage element, read word line 46 is brought high. This turns on N-Channel MOS transistor 42. If the output of the active storage element is high, N-Channel MOS transistor 44 will be off because its gate is low (through inverter 34) and the bit line 38 will remain high. If the output of the active storage element is low, N-Channel MOS transistor 44 will be on because its gate is high (through inverter 34) and the bit line 38 will be pulled low through N-Channel MOS transistors 42 and 44.

To write to the active storage element, N-Channel MOS transistor 36 is turned on by placing a high level on write word line 40. Transistor 36 turns on and forces the common node comprising the output of inverter 34 and the input of inverter 32 to the state of bit line 38.

The prior art re-programmable interconnect architecture described above contains far more switching elements than are needed to configure any specified connectivity pattern. This is due to the design restraints that the architecture must be general and there must be enough freedom for the router to accomplish the desired connectivity. Also, in general, it may be observed that, when the architecture is programmed to implement some specified connectivity, the programmed switching elements are not concentrated in a particular region of the circuit. This is because the objects to be connected (I/O pads or logic devices) are geometrically spread over the architecture, so the "on" switches which connect them are also not clustered. Typically this means that only a small number of switches are "on" for any specified interconnectivity.

Figure 3:
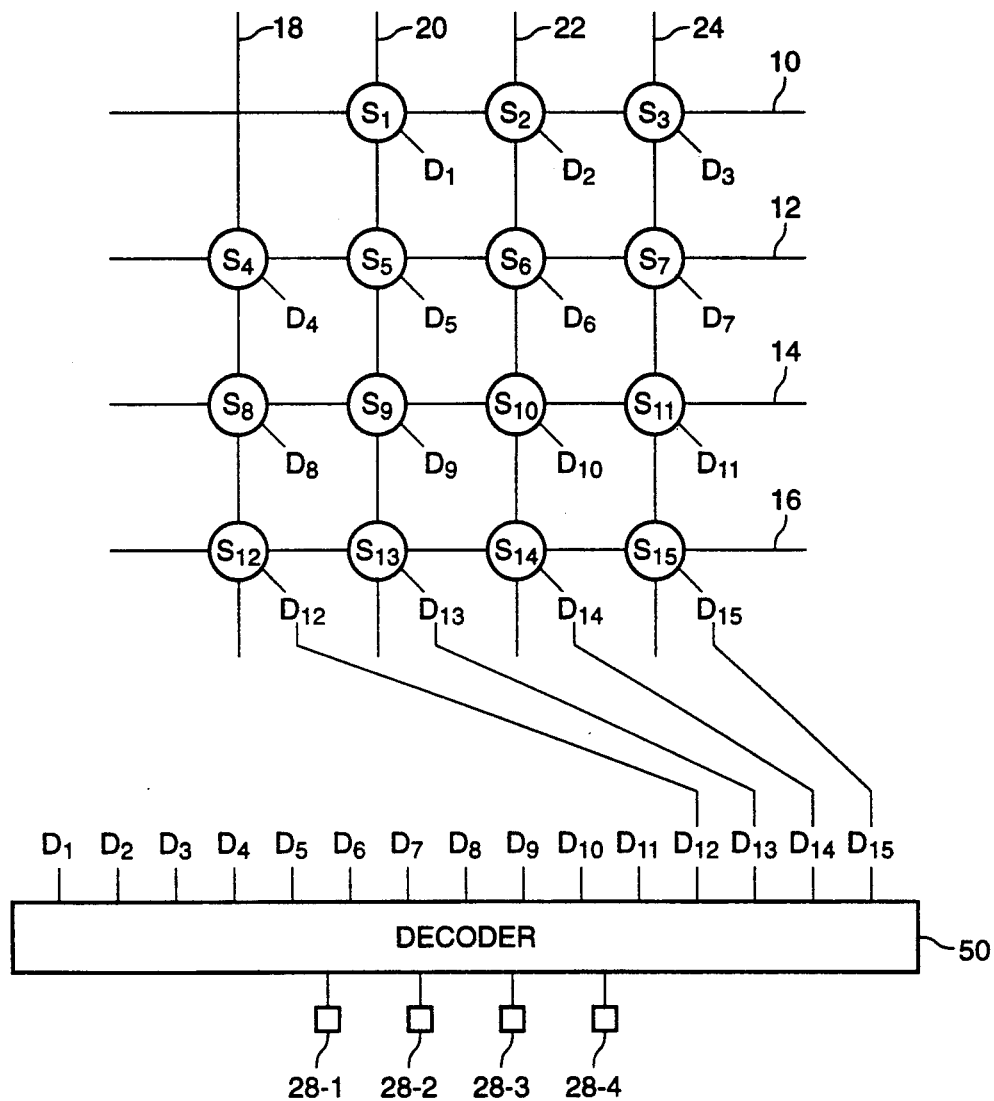
FIG. 3 is a schematic/block diagram of a portion of a user re-programmable interconnect architecture according to a first embodiment of the present invention.

Referring now to FIG. 3, a user-re-programmable interconnect architecture according to a first embodiment of the invention is depicted in combined block and schematic diagram form. Horizontal interconnect conductors 10, 12, 14, and 16 are shown intersecting vertical interconnect conductors 18, 20, 22, and 24. User-reprogrammable interconnect elements $S_1$-$S_{15}$ are shown at the intersections of the horizontal and vertical interconnect conductors. It will be noted that, according to a presently preferred embodiment of the invention, not all intersections are populated by user re-programmable interconnect elements (the intersection of interconnect conductors 10 and 18 remains unpopulated).

Unlike the prior art architectures which provide one active storage element for each user re-programmable interconnect element, the embodiment of FIG. 3 includes only active storage elements 28-1 through 28-4. Active storage elements 28-1 through 28-4 are used to drive decoder circuit 50. Decoder 50 may be a conventional decoder which translates a 4-bit binary input from active storage elements 28-1 through 28-4 to a one-of-fifteen high-active signal as is well known in the art. The outputs $D_1$ through $D_{15}$ are used to drive user-reprogrammable interconnect elements $S_1$-$S_{15}$, respectively.

By employing the present invention, the number of active storage elements required to drive fifteen user re-programmable interconnect elements is reduced from fifteen to four. It is preferred to provide one state of decoder 50 which does not turn on any user reprogrammable interconnect element in order to allow for interconnection networks in which none of user-reprogrammable interconnect elements $S_1$-$S_{15}$ are activated. In the embodiment of FIG. 3, this is accomplished by leaving one intersection (that of horizontal interconnect conductor 10 and vertical interconnect conductor 18) unpopulated so that address 0000 (binary) does not drive any output. Those of ordinary skill in the art will recognize that other similar schemes are possible to achieve this result.

Figure 4:
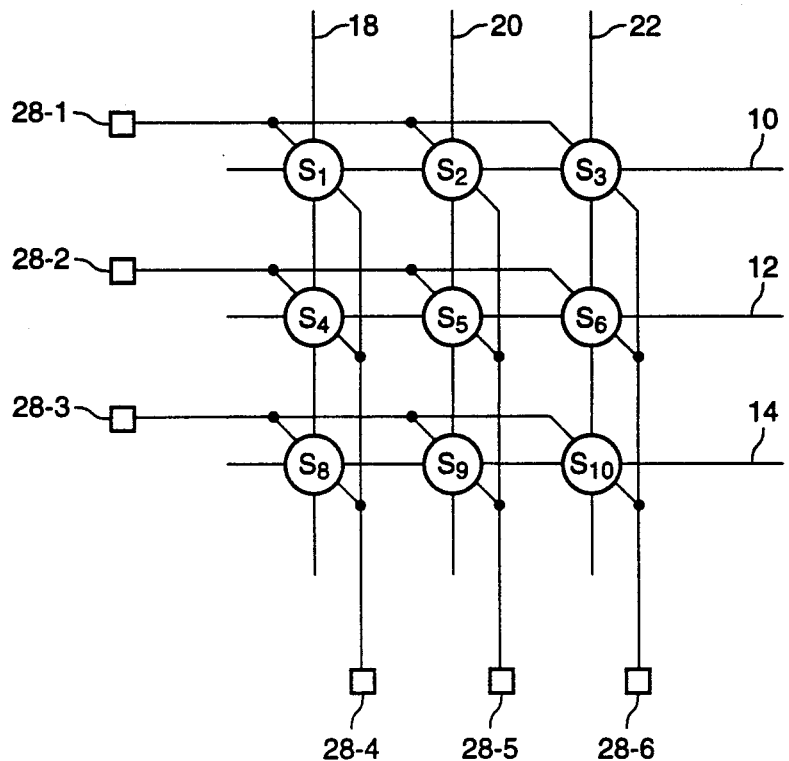
FIG. 4 is a schematic/block diagram of a user re-programmable interconnect architecture according to a second embodiment of the present invention.

Referring now to FIG. 4, an architecture 60 according to a second embodiment of the invention is depicted. Horizontal interconnect conductors 10, 12, and 14 are shown intersected by vertical conductors 18, 20, and 22. User re-programmable interconnect elements $S_1$-$S_9$ are shown populating the intersections of the horizontal and vertical interconnect conductors.

The states of active storage cells 28-1, 28-2, and 28-3 and their complements are placed onto pairs of lines 64, 66, and 68. Although three lines are shown, those of ordinary skill in the art will recognize that each of lines 64, 66, and 68 comprise a pair of lines carrying complementary signals. Similarly, the states of active storage cells 28-4, 28-5, and 28-6 and their complements are placed onto pairs of lines 72, 74, and 76. The signals from the active storage cells 28-1, 28-2, 28-3, 28-4, 28-5, and 28-6 may be ANDed together to produce the signal to drive any one of switches $S_1$-$S_9$.

Figure 5:
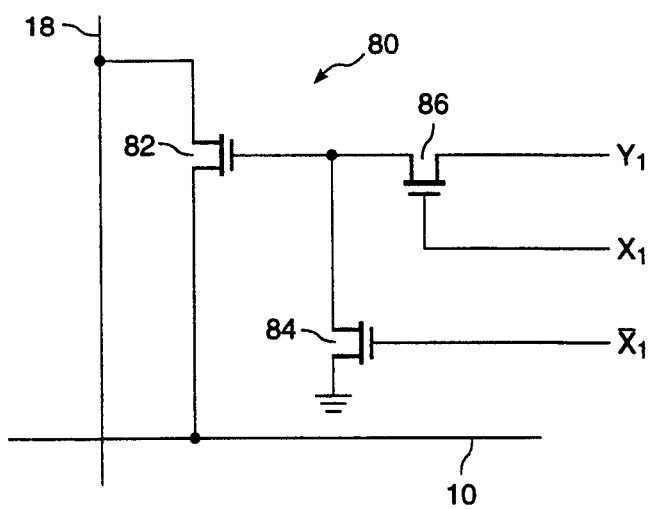
FIG. 5 is a schematic diagram of a typical ANDing circuit switching element which may be used in the user re-programmable interconnect architecture of FIG. 4.

Appropriate switching circuitry 80 for accomplishing the ANDing of these control signals is shown in FIG. 5. FIG. 5 shows in detail the intersection of horizontal interconnect conductor 10 and vertical interconnect conductor 18. Switch $S_1$ comprises N-Channel MOS transistor 82. N-Channel MOS transistors 84 and 86 comprise and AND gate for controlling the gate of N-Channel MOS transistor 82. N-Channel MOS transistor 84 is connected between the gate of N-Channel MOS transistor 82 and ground, and has its gate connected to the complement of the X active storage cell for the first row of the switch matrix. N-Channel MOS transistor 86 is connected between the gate of N-Channel MOS transistor 82 and the output of the Y active storage cell for the first column of the switch matrix, and has its gate connected to the X active storage cell output signal for the first row of the switch matrix. If the decoder signals are active high, N-Channel MOS transistor 84 will be turned on, shorting the gate of N-Channel MOS transistor 82 to ground unless the row containing switch $S_1$ is selected. If the row is selected, the gate of N-Channel MOS transistor 82 is brought high only if the column containing switch $S_1$ is selected.

Figure 6:
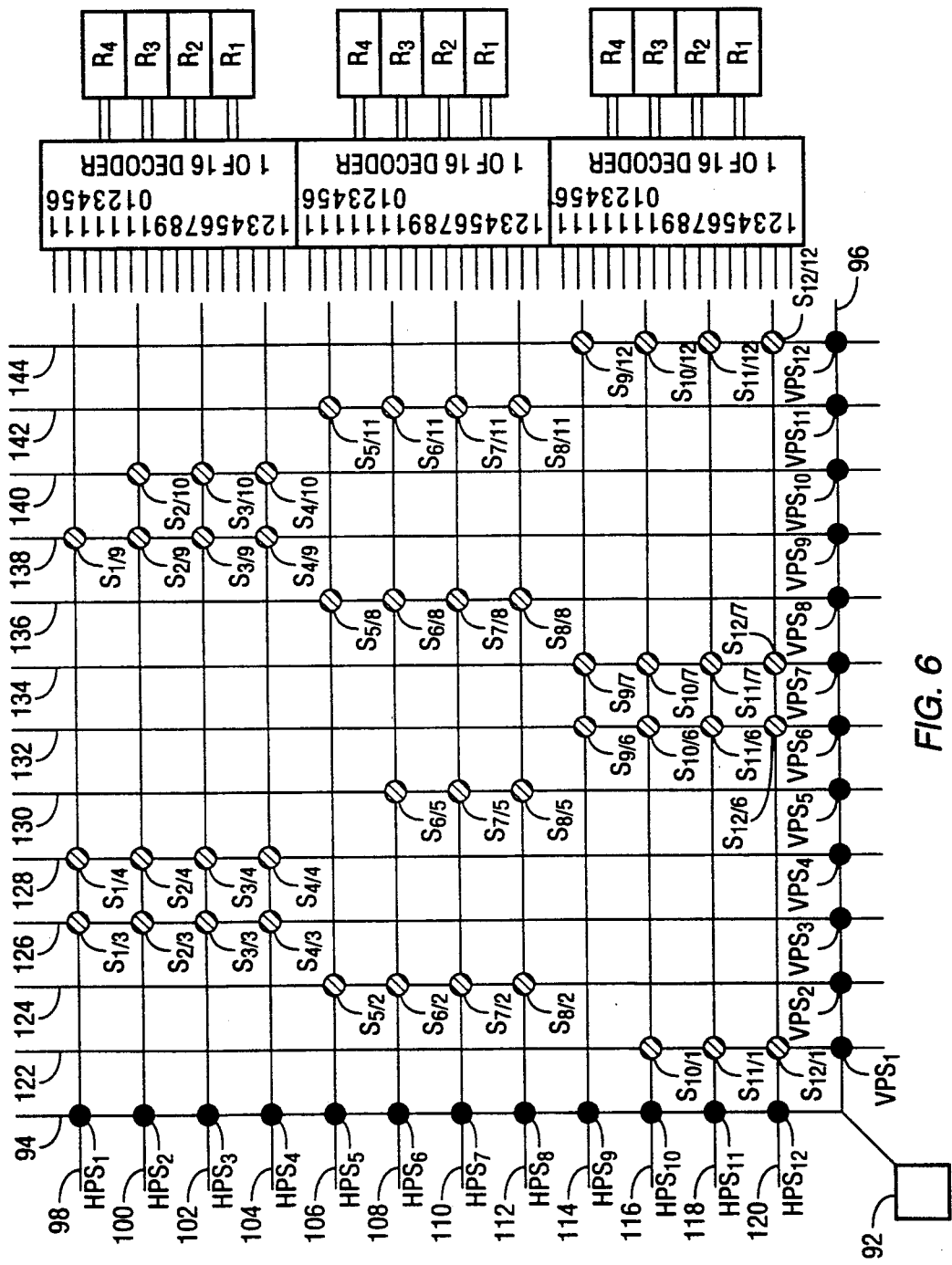
FIG. 6 is a schematic diagram of a portion of a user re-programmable interconnect architecture according to a third embodiment of the present invention.

Referring now to FIG. 6, an user re-configurable interconnect architecture according to a third embodiment of the present invention is depicted. The embodiment of FIG. 6 is especially suitable for use as a part of an interconnect matrix implementation.

An I/O pad 92 is electrically connected to pad stubs 94 and 96. Pad stubs 94 and 96 are orthogonally oriented to one another. Vertical pad stub 94 is oriented orthogonal to a plurality of horizontal interconnect conductors (12 are shown) 98, 100, 102, 104, 106, 108, 110, 112, 114, 116, 118, and 120. Horizontal pad stub 96 is oriented orthogonal to a plurality of vertical interconnect conductors (12 are shown) 122, 124, 126, 128, 130, 132, 134, 136, 138, 140, 142, and 144.

The horizontal and vertical interconnect conductors may be connected to the I/O pad 92 through the pad stubs 94 and 96 by user re-programmable interconnect elements. According to a presently preferred embodiment of the invention, the intersections of the horizontal interconnect conductors and the vertical pad stub 94 are fully populated by user re-programmable interconnect elements $HPS_1$-$HPS_{12}$, and the intersections of the vertical interconnect conductors and the horizontal pad stub 96 are fully populated by user reprogrammable interconnect elements $VPS_1$-$VPS_{12}$.

In addition, the horizontal and vertical interconnect conductors may be connected to one another by user re-programmable interconnect elements. It is apparent from an examination of FIG. 6 that the intersection matrix formed by the horizontal and vertical interconnect conductors are not fully populated by user re-programmable interconnect elements.

In the embodiment of FIG. 6, the interconnect elements are divided into three groups. The first group includes re-programmable interconnect elements (in a format $S_{X/Y}$, where X is the position of the x conductor and Y is the position of the Y conductor) $S_1$, $S_1$, and $S_{1/9}$; $S_1$, $S_{2/4}$, $S_{2/9}$ and $S_{2/10}$; $S_{3/3}$, $S_1$, $S_{3/9}$, and $S_{3/10}$; and $S_{4/3}$, $S_{4/4}$, $S_{4/9}$, and $S_{4/10}$. The first group of re-programmable interconnect elements are controlled by the fifteen outputs of first decoder 146, which is driven by active storage elements 28-1 to 28-4. The second group includes re-programmable interconnect elements $S_{5/2}$, $S_1$, and $S_{5/11}$; $S_{6/2}$, $S_{6/5}$, $S_{6/8}$, and $S_{6/11}$; $S_{7/2}$, $S_{7/5}$, $S_1$, and $S_{7/11}$; and $S_{8/2}$, $S_{8/5}$, $S_{8/8}$, and $S_{8/11}$. The second group of re-programmable interconnect elements are controlled by the fifteen outputs of second decoder 148, which is driven by active storage elements 28-5 to 28-8. The third group includes re-programmable interconnect elements $S_{9/6}$, $S_{9/7}$, and $S_{9/12}$, and $S_{10/1}$; $S_{10/6}$, $S_{10/7}$, and $S_{10/12}$; $S_{11/1}$, $S_{11/6}$, $S_{11/7}$, and $S_{11/12}$; and $S_{12/1}$, $S_{12/6}$, $S_{12/7}$, and $S_{12/12}$. The third group of re-programmable interconnect elements are controlled by the fifteen outputs of third decoder 150, which is driven by active storage elements 28-9 to 28-12. Switches are omitted from positions 1/10, 5/5, and 9/1 to provide for a null address at each of decoders 146, 148, and 150, as previously described.

Figure 7A:
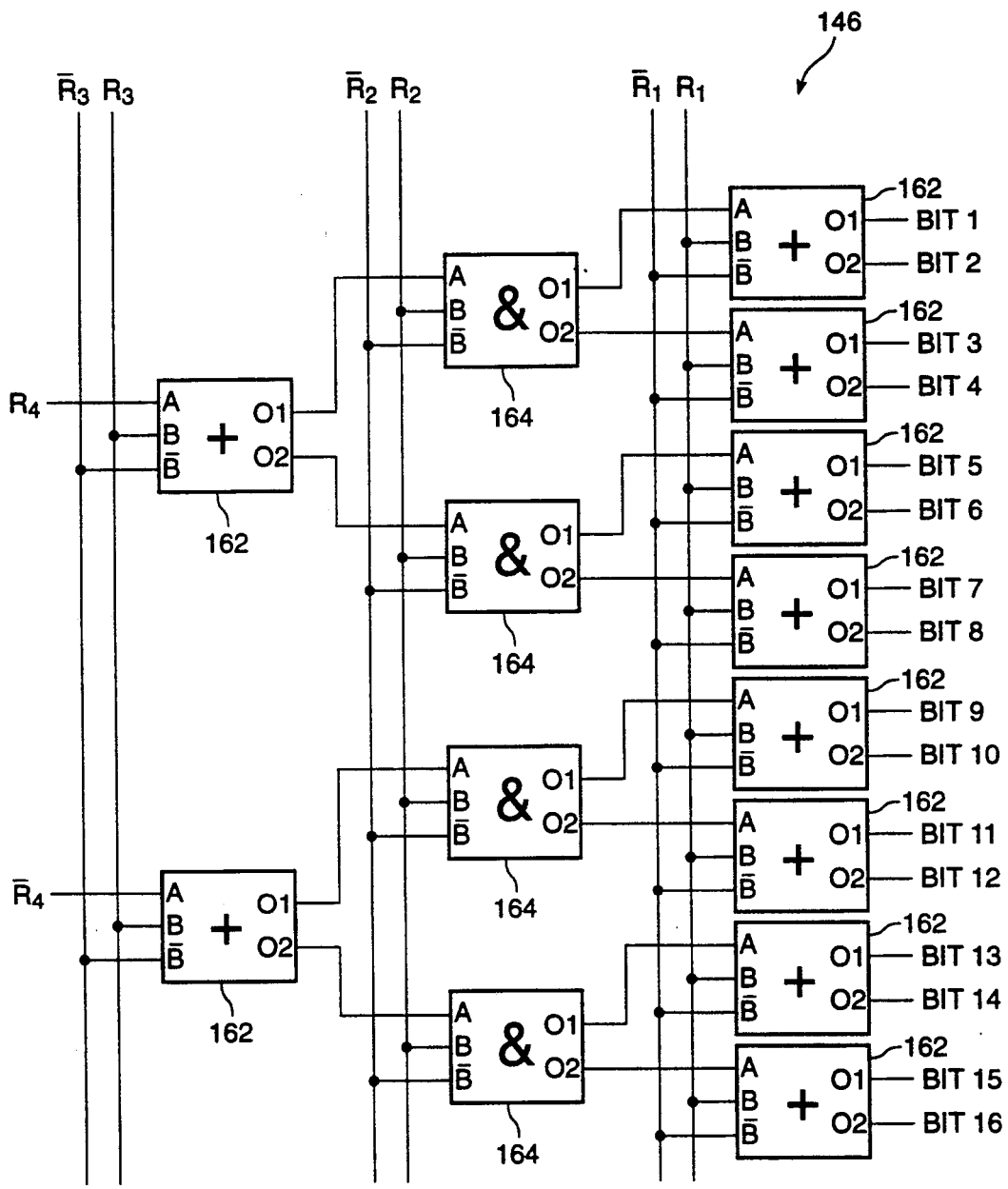
FIG. 7a is a block diagram of a decoder circuit for use in the architecture of FIG. 6.

An example of a circuit for use as decoders 146, 148, and 150 is shown in block diagram form in FIG. 7a. The circuit is comprised of a group of two-input NOR-decode circuits 162 and a group of two-input NAND-decode circuits 164. The NOR and NAND decode circuits are driven by complementary pairs of outputs of the four active storage elements which drive them (active storage elements 28-1 through 28-4 are shown as an example). Those of ordinary skill in the art will recognize that complementary outputs are available from circuits like that shown in FIG. 2. The output signal and its complement are available from the outputs of inverters 32, and 34, respectively. Those of ordinary skill in the art will readily realize that numerous variations of the circuit of FIG. 7a are possible.

Figure 7B:
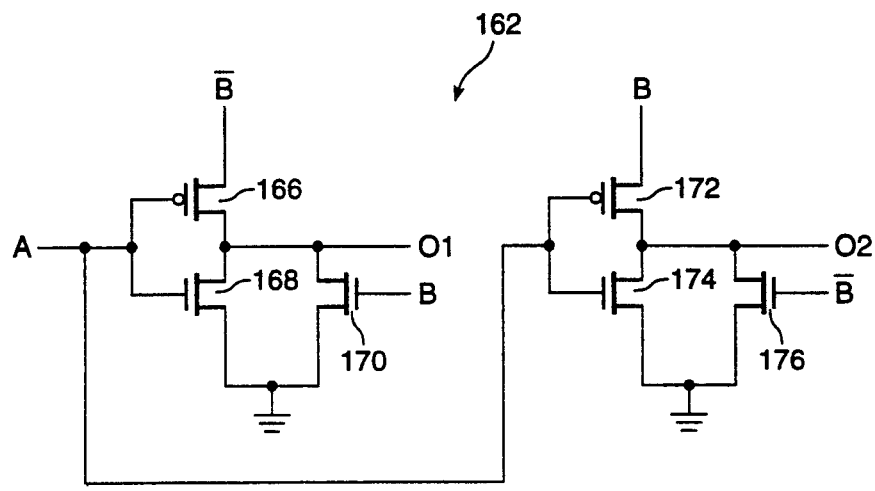
Figure 7C:
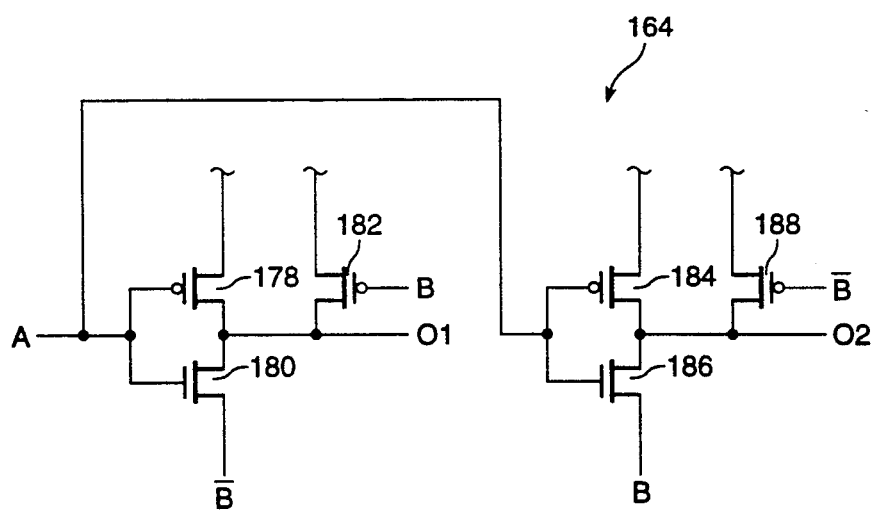

Schematic diagrams of exemplary NOR and NAND decode circuits are shown, respectively, in FIGS. 7b and 7c. Referring now to FIG. 7b, an exemplary two-input NOR circuit 162 is shown in schematic diagram form. In a first section of NOR-decode circuit 162, P-channel MOS transistor 166 and N-Channel MOS transistor 168 form an inverter, the input of which is the first input (A) to the OR circuit. N-Channel MOS transistor 168 is shunted by N-Channel MOS transistor 170, the gate of which forms the second input (B) to the OR circuit. The source of P-Channel MOS transistor 166 is connected to the complement of the (B) input. The output 01 of NOR-decode circuit 162 is the common drain connection of P-Channel MOS transistor 166 and N-Channel MOS transistor 168.

A second section of NOR-decode circuit 162 is identical to the first section, and comprises P-Channel MOS transistor 172 and N-Channel MOS transistor 174 forming an inverter, the input of which is also connected to the (A) input to the NOR-decode circuit. N-Channel MOS transistor 176 is shunted by N-Channel MOS transistor 170, the gate of which is connected to the complement of the (B) input. The source of P-Channel MOS transistor 166 is connected to the (B) input. The output 02 of NOR-decode circuit 162 is the common drain connection of P-Channel MOS transistor 172 and N-Channel MOS transistor 174.

Referring now to FIG. 7c, an exemplary two-input NAND-decode circuit 162 is shown in schematic diagram form. In a first section of AND circuit 164, P-Channel MOS transistor 178 and N-Channel MOS transistor 180 form an inverter, the input of which is the first input (A) to the NAND-decode circuit. P-Channel MOS transistor 178 is shunted by P-Channel MOS transistor 182, the gate of which forms the second input (B) to the NAND-decode circuit. The source of N-Channel MOS transistor 180 is connected to the complement of the (B) input. The output 01 of NAND-decode circuit 164 is the common drain connection of P-Channel MOS transistor 178 and N-Channel MOS transistor 180.

A second section of NAND-decode circuit 164 is identical to the first section, and comprises P-Channel MOS transistor 184 and N-Channel MOS transistor 186 forming an inverter, the input of which is also connected to the (A) input to the NAND-decode circuit. P-Channel MOS transistor 184 is shunted by P-Channel MOS transistor 188, the gate of which is connected to the complement of the (B) input. The source of N-Channel MOS transistor 186 is connected to the (B) input. The output 02 of NAND-decode circuit 164 is the common drain connection of P-Channel MOS transistor 172 and N-Channel MOS transistor 174.

Figure 8:
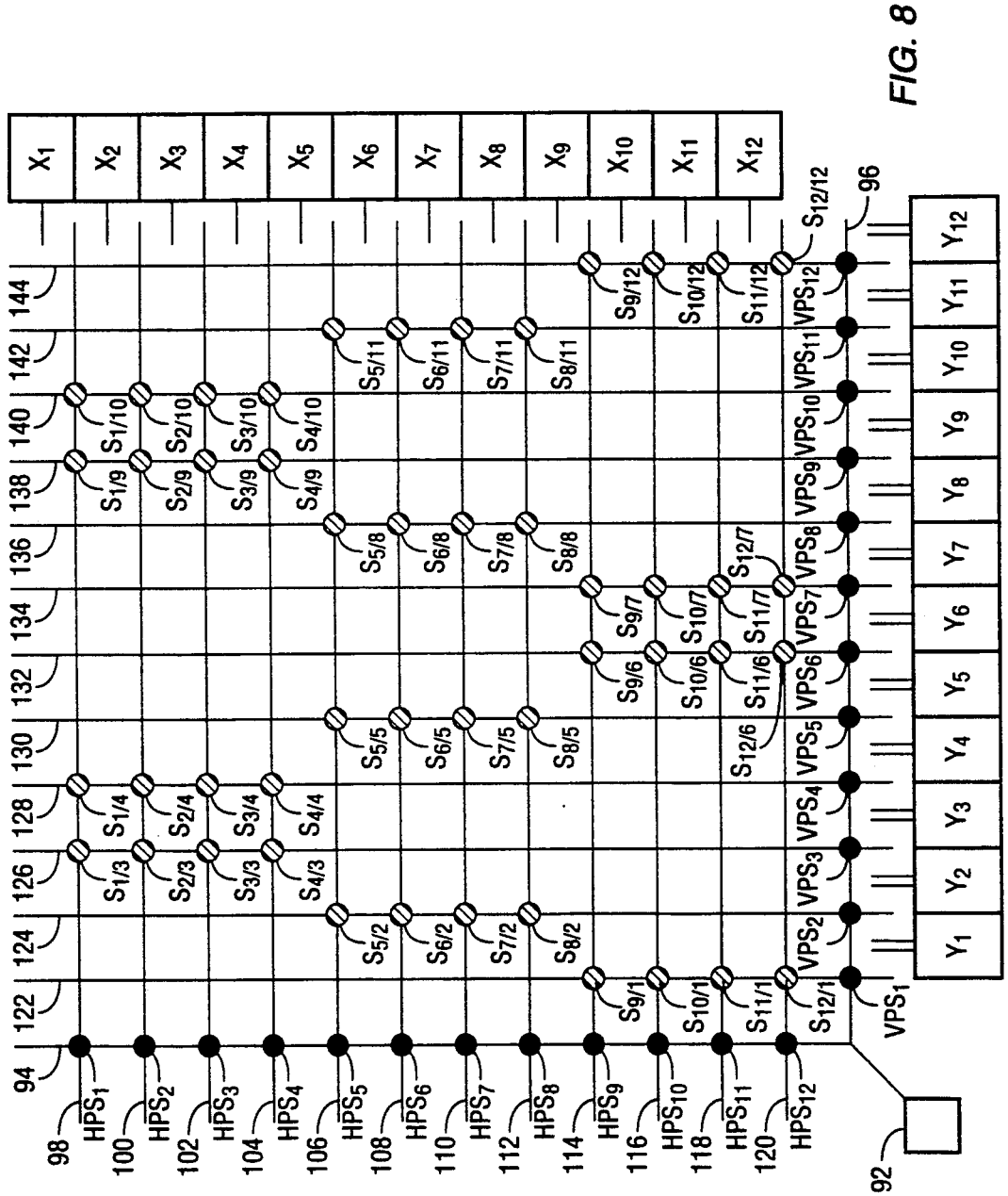
FIG. 8 is a schematic diagram of a portion of a user re-programmable interconnect architecture according to a fourth embodiment of the present invention.

A presently preferred embodiment of a user re-programmable interconnect architecture including multiple I/O connections is depicted in FIG. 8. The switching matrix of the embodiment of FIG. 8 is identical to the embodiment of FIG. 6. Elements in FIG. 8 identical to elements in FIG. 6 are given like reference numerals. Therefore, an I/O pad 92 is electrically connected to pad stubs 94 and 96. Pad stubs 94 and 96 are orthogonally oriented to one another. Vertical pad stub 94 is oriented orthogonal to a plurality of horizontal interconnect conductors (12 are shown) 98, 100, 102, 104, 106, 108, 110, 112, 114, 116, 118, and 120. Horizontal pad stub 96 is oriented orthogonal to a plurality of horizontal interconnect conductors (12 are shown) 122, 124, 126, 128, 130, 132, 134, 136, 138, 140, 142, and 144.

The horizontal and vertical interconnect conductors may be connected to the I/O pad 92 through the pad stubs 94 and 96 by user re-programmable interconnect elements. These user-reprogrammable interconnect elements may each be driven by a separate active storage element as is known in the art. According to a presently preferred embodiment of the invention, the intersections of the horizontal interconnect conductors and the vertical pad stub 94 are fully populated by user re-programmable interconnect elements $HPS_1$–$HPS_{12}$, and the intersections of the vertical interconnect conductors and the horizontal pad stub 96 are fully populated by user re-programmable interconnect elements $VPS_1$–$VPS_{12}$.

In addition, the horizontal and vertical interconnect conductors may be connected to one another by user re-programmable interconnect elements. Unlike the embodiment of FIG. 6, the intersection matrix formed by the horizontal and vertical interconnect conductors in the embodiment of FIG. 8 are fully populated by user re-programmable interconnect elements. This is made possible by the decoding scheme employed in the embodiment of FIG. 8.

As in the embodiment of FIG. 6, the interconnect elements in the embodiment of FIG. 8 are divided into three groups. The first group includes re-programmable interconnect elements (in a format $S_{X/Y}$, where X is the position of the x conductor and Y is the position of the Y conductor) $S_{1/1}$, $S_{1/4}$, $S_{1/9}$ and $S_{1/10}$; $S_{2/1}$, $S_{2/4}$, $S_{2/9}$ and $S_{2/10}$; $S_{3/3}$, $S_{3/4}$, $S_{3/9}$, and $S_{3/10}$; and $S_{4/3}$, $S_{4/4}$, $S_{4/9}$, and $S_{4/10}$. The second group includes re-programmable interconnect elements $S_{5/2}$, $S_{5/5}$ $S_{5/8}$, and $S_{5/11}$; $S_{6/2}$, $S_{6/5}$, $S_{6/8}$, and $S_{6/11}$; $S_{7/2}$, $S_{7/5}$, $S_{7/8}$, and $S_{7/11}$; and $S_{8/2}$, $S_{8/5}$, $S_{8/8}$, and $S_{8/11}$. The third group includes re-programmable interconnect elements $S_{9/1}$, $S_{9/6}$, $S_{9/7}$, and $S_{9/12}$, and $S_{10/1}$, $S_{10/6}$, $S_{10/7}$, and $S_{10/12}$; $S_{11/1}$, $S_{11/6}$, $S_{11/7}$, and $S_{11/12}$; and $S_{12/1}$, $S_{12/6}$, $S_{12/7}$, and $S_{12/12}$. Thus the matrix of 48 possible switch positions is populated by all 48 switches.

However, instead of decoders 146, 148, and 150 as in the embodiment of FIG. 6, the embodiment of FIG. 8 includes twelve X active storage elements $X_1$-$X_{12}$ and twelve Y active storage elements $Y_1$-$Y_{12}$. Thus a total of twenty-four active storage elements are used to directly control 45 user re-programmable interconnect elements via a partial addressing scheme. A selected user re-programmable interconnect element is turned on by storing a high level in its associated X and Y active storage elements. The AND function of the user re-programmable interconnect element may be performed by the circuit of FIG. 5.

Those of ordinary skill in the art will recognize that, while the embodiment of FIG. 8 has been disclosed as a CMOS embodiment, the principles disclosed herein may be employed in a straightforward manner to construct a bipolar transistor embodiment.

Figure 9:
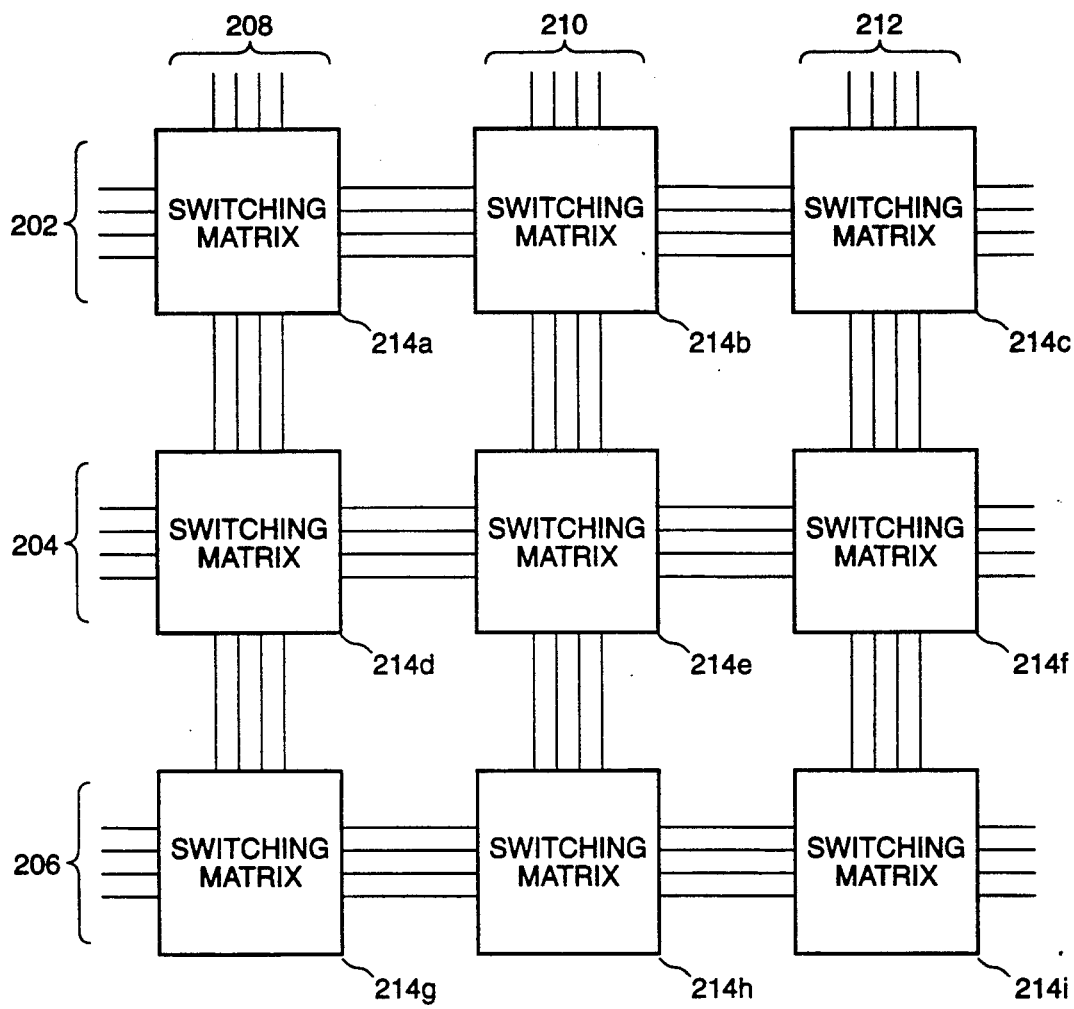
FIG. 9 is a block diagram of a portion of an integrated circuit according to the present invention incorporating the architecture shown in any of FIGS. 3, 4, 6, or 8.

Referring now to FIG. 9, a block diagram of a portion of an integrated circuit incorporating the user re-programmable interconnect architecture according to the present invention is presented. A plurality of groups of horizontal interconnect conductors 202, 204, and 206 and vertical interconnect conductors 208, 210, and 212 intersect at a plurality of switching matrices 214a-214i. Switching matrices 214a-214i may incorporate the architecture shown in any of FIGS. 3, 4, 6, or 8 herein. Those of ordinary skill in the art will recognize that FIG. 9 is merely illustrative, and the fact that it illustrates groups of four horizontal interconnect conductors 202, 204, and 206 and vertical interconnect conductors 208, 210, and 212 and nine switching matrices is not to be taken as a limitation. The principle shown in FIG. 9 may be applied to interconnect arrays of any size.

Figure 10:
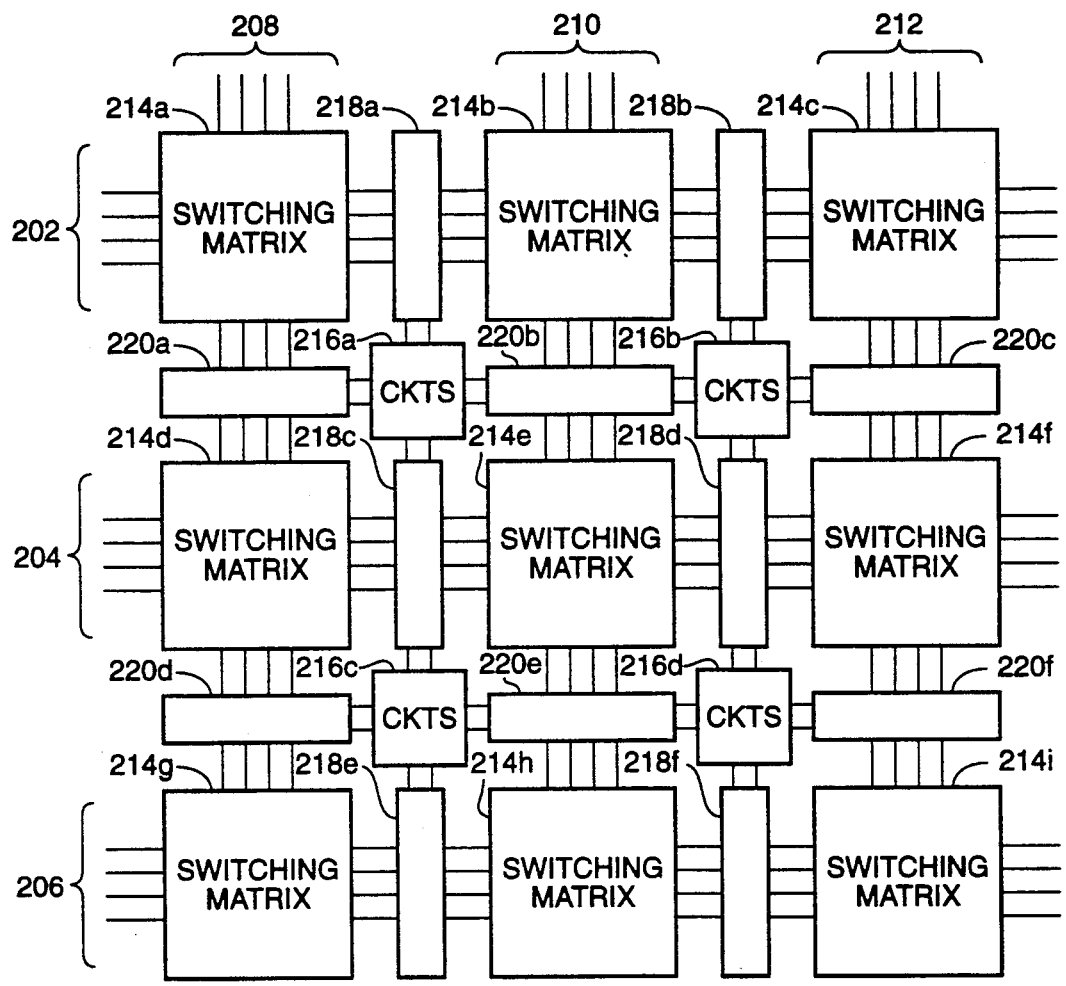
FIG. 10 is a block diagram of a portion of an integrated circuit according to the present invention incorporating the architecture shown in any of FIGS. 3, 4, 6, or 8, incorporating user re-programmable circuitry.

Referring now to FIG. 10, a portion of an integrated circuit containing a user reprogrammable interconnect architecture which is a variation of the user re-programmable interconnect architecture of FIG. 9 is shown in block diagram form. As in the embodiment of FIG. 9, a plurality of groups of horizontal interconnect conductors 202, 204, and 206 and vertical interconnect conductors 208, 210, and 212 intersect at a plurality of switching matrices 214a-214i. Switching matrices 214a-214i may incorporate the architecture shown in any of FIGS. 3, 4, 6, or 8 herein.

In addition, circuits 216a-216d are disposed throughout the matrix. As those of ordinary skill in the art will recognize, circuits 216a-216d may comprise fixed circuits of any nature, as well as user programmable circuits, of which there are many known varieties. The inputs and outputs of circuits 216a-216d (a total of four inputs/outputs are shown for each) are connectable to horizontal interconnect conductors 202, 204, and 206 through switching matrices 218a-218f and to vertical interconnect conductors 208, 210, and 212 through switching matrices 220a-220f. Switching matrices 218a-218f and 220a-220f may incorporate the architecture shown in any of FIGS. 3, 4, 6, or 8 herein.

Those of ordinary skill in the art will recognize that FIG. 10 is merely illustrative, and the number of conductors, switch matrices, and circuits illustrated therein is not to be taken as a limitation. The principle shown in FIG. 10 may be applied to interconnect arrays of any size.

The use of the architecture of the present invention represents an improvement over the prior art. By employing the architecture of the present invention, smaller layout areas, higher speeds, and reduced transistor counts are achieved. Fewer peripheral registers are needed for programming the SRAM cells which drive the switches. No significant loss of routability is suffered.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A user re-programmable interconnect architecture comprising:

a plurality of interconnect conductors;

an I by J array of N user re-programmable interconnect elements connected between different selected ones of said plurality of interconnect conductors, where I, J, and N are integers and I+J is greater than 2, each of said user re-programmable interconnect elements being switchable between an on state and an off state in response to the state of a control signal;

M active storage elements, each having a first unselected state and a second selected state, where M is an integer and M<N;

decoder means having M inputs connected to outputs of said active storage elements and having N outputs, each of said outputs providing a control signal to one of said N user re-programmable interconnect elements, said control signal having an on state and an off state, and wherein the state of each control signal is a function of the state of the M inputs of said decoder means.

2. The user re-programmable interconnect architecture of claim 1 wherein a selected state of the M inputs of said decoder means causes each control signal from said decoder means to assume said off state.

3. A user re-programmable interconnect architecture comprising:

a plurality of interconnect conductors;

N user re-programmable interconnect elements connected between different selected ones of said plurality of interconnect conductors, where N is an integer, each of said user re-programmable interconnect elements being switchable between an on state and an off state in response to the state of a control signal;

M active storage elements, each having a first unselected state and a second selected state, where M is an integer and M<N;

decoder means having M inputs connected to outputs of said active storage elements and having N outputs, each of said outputs providing a control signal to one of said N user re-programmable interconnect elements, said control signal having an on state and an off state, wherein the state of each control signal is a function of the state of the M inputs of said decoder means, a selected state of the M inputs of said decoder means causes each control signal from said decoder means to assume said off state, and wherein said active storage elements comprise SRAM cells, said user re-programmable interconnect elements comprise MOS transistors, and said decoder means comprises a one of N decoder circuit.

4. A user re-programmable interconnect architecture comprising:
- a plurality of interconnect conductors comprising a group of interconnect conductors;
- N user re-programmable interconnect elements connected between different selected ones of said plurality of interconnect conductors in said group, where N is an integer, each of said user re-programmable interconnect elements being switchable between an on state and an off state in response to the state of a control signal;
- a decoder/driver means associated with each of said user re-programmable interconnect elements, each of said decoder/driver means having a first input and a second input, for decoding input signals and an output connected to a single associated user re-programmable interconnect element, for driving its associated user re-programmable interconnect element in response to signals at its first and second inputs;
- $M_1$ first active storage elements, each having a first unselected state and a second selected state available at an output thereof, where $M_1$ is an integer, the output of each of said first active storage elements connected to the first inputs of a different subset of said decoder/driver means;
- $M_2$ second active storage elements, each having a first unselected state and a second selected state available at an output thereof, where $M_2$ is an integer, the output of each of said second active storage elements connected to the second inputs of a different subset of said decoder/driver means such that the first and second inputs of each of said decoder/driver means are connected to the outputs of one each of said first and second active storage elements; and
- wherein each of said decoder/driver means will switch its associated user re-programmable interconnect element to its on state in response to said selected state outputs appearing at both its first and second inputs, and wherein $M_1 + M_2 < N$.

5. A user re-programmable interconnect architecture comprising:
- a plurality of interconnect conductors comprising a group of interconnect conductors;
- N user re-programmable interconnect elements connected between different selected ones of said plurality of interconnect conductors in said group, where N is an integer, each of said user re-programmable interconnect elements being switchable between an on state and an off state in response to the state of a control signal;
- a decoder/driver means associated with each of said user re-programmable interconnect elements, each of said decoder/driver means having a first input and a second input, for decoding input signals and an output connected to its associated user re-programmable interconnect element, for driving its associated user re-programmable interconnect element in response to signals at its first and second inputs;
- $M_1$ first active storage elements, each having a first unselected state and a second selected state available at an output thereof, where $M_1$ is an integer, the output of each of said first active storage elements connected to the first inputs of a different subset of said decoder/driver means;
- $M_2$ second active storage elements, each having a first unselected state and a second selected state available at an output thereof, where $M_2$ is an integer, the output of each of said second active storage elements connected to the second inputs of a different subset of said decoder/driver means such that the first and second inputs of each of said decoder/driver means are connected to the outputs of one each of said first and second active storage elements;
- wherein each of said decoder/driver means will switch its associated user re-programmable interconnect element to its on state in response to said selected state outputs appearing at both its first and second inputs, and wherein $M_1 + M_2 < N$ and wherein said active storage elements comprise SRAM cells, said user-reprogrammable interconnect elements comprise MOS transistors, and said decoder/driver means comprise ANDing circuits.

6. A user re-programmable interconnect architecture comprising:
- a plurality of interconnect conductors comprising a group of interconnect conductors;
- N user re-programmable interconnect elements connected between different selected ones of said plurality of interconnect conductors in said group, where N is an integer, each of said user re-programmable interconnect elements switchable between an on state and an off state in response to the state of a control signal;
- $M_1$ first active storage elements, each having a first unselected state and a second selected state available at an output thereof, where $M_1$ is an integer;
- first decoder means having $M_1$ inputs connected to outputs of said first active storage elements and having a plurality of outputs, each of said outputs providing a control signal to one of said N user re-programmable interconnect elements in a first subgroup thereof, wherein the state of each control signal is a function of the state of the $M_1$ inputs of said first decoder means;
- $M_2$ second active storage elements, each having a first unselected state and a second selected state available at an output thereof, where $M_2$ is an integer; and
- second decoder means having $M_2$ inputs connected to outputs of said active storage elements and having a plurality of outputs, each of said outputs providing a control signal to one of said N user re-programmable interconnect elements in a second subgroup thereof, wherein the state of each control signal is a function of the state of the $M_2$ inputs of said second decoder means; and
- wherein $M_1 + M_2 < N$.

7. The user re-programmable interconnect architecture of claim 6 wherein:

a selected state of the $M_1$ inputs of said first decoder means causes each control signal from said first decoder means to assume said off state; and a selected state of the $M_2$ inputs of said second decoder means causes each control signal from said second decoder means to assume said off state.

8. The user re-programmable interconnect architecture of claim 7 wherein said active storage elements comprise SRAM cells, said user re-programmable interconnect elements comprise MOS transistors, and said first and second decoder means comprise a one of N decoder circuit.

9. A user re-programmable interconnect architecture comprising:

a plurality of interconnect conductors comprising a group of interconnect conductors;

N user re-programmable interconnect elements connected between different selected ones of said plurality of interconnect conductors in said group, where N is an integer, each of said user re-programmable interconnect elements having a first control input and a second control input, each of said user re-programmable interconnect elements being switchable between an on state and an off state in response to the state of an internally-generated control signal;

$M_1$ first active storage elements, each having a first unselected state and a second selected state and an output, where $M_1$ is an integer, the output of each first active storage element providing an off output signal if said storage element is in its unselected state and an on signal if said storage element is in its selected state, each of said outputs connected to a first control input of each of a first group of said user re-programmable interconnect elements;

$M_2$ second active storage elements, each having a first unselected state and a second selected state and an output, where $M_2$ is an integer, the output of each second active storage element providing an off output signal if said storage element is in its unselected state and an on signal if said storage element is in its selected state, each of said outputs connected to a second control input of a second group of said user re-programmable interconnect elements such that each of said user re-programmable interconnect elements is connected to an output from one of said first and one of said second active storage elements;

control-signal generating means, in each of said user re-programmable interconnect elements, for generating said control signal to place it in its on state in response to the presence of on output signals from the first and second active storage elements to which it is connected; and wherein $M_1 + M_2 < N$.

10. A user re-programmable interconnect architecture comprising:

a plurality of interconnect conductors comprising a group of interconnect conductors;

N user re-programmable interconnect elements connected between different selected ones of said plurality of interconnect conductors in said group, where N is an integer, each of said user re-programmable interconnect elements having a first control input and a second control input, each of said user re-programmable interconnect elements being switchable between an on state and an off state in response to the state of an internally-generated control signal;

$M_1$ first active storage elements, each having a first unselected state and a second selected state and an output, where $M_1$ is an integer, the output of each first active storage element providing an off output signal if said storage element is in its unselected state and an on signal if said storage element is in its selected state, each of said outputs connected to a first control input of each of a first group of said user re-programmable interconnect elements;

$M_2$ second active storage elements, each having a first unselected state and a second selected state and an output, where $M_2$ is an integer, the output of each second active storage element providing an off output signal if said storage element is in its unselected state and an on signal if said storage element is in its selected state, each of said outputs connected to a second control input of a second group of said user re-programmable interconnect elements such that each of said user re-programmable interconnect elements is connected to an output from one of said first and one of said second active storage elements;

control-signal generating means, in each of said user re-programmable interconnect elements, for generating said control signal to place it in its on state in response to the presence of on output signals from the first and second active storage elements to which it is connected;

wherein $M_1 + M_2 < N$ and wherein said active storage elements comprise SRAM cells, said user re-programmable interconnect elements comprise MOS transistors, and each of said control signal generating means comprises an ANDing circuit.

11. A user re-programmable interconnect architecture disposed on a microcircuit substrate comprising:

an input/output pad;

a first input/output pad conductor extending in a first direction from said input/output pad;

a second input/output pad conductor extending in a second direction from said input/output pad, said second direction substantially different from said first direction;

a plurality of first interconnect conductors insulated from and intersecting said first input/output pad conductor;

a plurality of second interconnect conductors insulated from and intersecting said second input/output pad conductor, said second interconnect conductors insulated from and forming intersections with said first interconnect conductors;

a plurality of first user re-programmable interconnect elements, one of said first user re-programmable interconnect elements connected between each of said first interconnect conductors and said first input/output pad conductor, each of said first user re-programmable interconnect elements being switchable between an on state and an off state in response to the state of a control signal;

a first plurality of active storage elements, each one of said first plurality of active storage elements having a first unselected state and a second selected state and providing said control signal to a different one of said plurality of first user re-programmable interconnect elements in response to its state;

a plurality of second user re-programmable interconnect elements, one of said second user re-programmable interconnect elements connected between each of said second interconnect conductors and said second input/output pad conductor, each of said second user re-programmable interconnect elements being switchable between an on state and an off state in response to the state of a control signal;

a second plurality of active storage elements, each one of said second plurality of active storage elements having a first unselected state and a second selected state and providing said control signal to a different one of said plurality of second user re-programmable interconnect elements in response to its state;

N third user re-programmable interconnect elements, where N is an integer, one of said third user re-programmable interconnect elements connected at selected ones of said intersections between said first and second interconnect conductors, each of said third user re-programmable interconnect elements being switchable between an on state and an off state in response to the state of a control signal;

$M_1$ third active storage elements each having an output and having a first unselected state and a second selected state, where $M_1$ is an integer, the output of each third active storage element providing an off output signal if said storage element is in its unselected state and an on signal if said storage element is in its selected state, each of said outputs connected to at least one first control input of each of a first group of said third user re-programmable interconnect elements;

$M_2$ fourth active storage elements, each having an output and a first unselected state and a second selected state, where $M_2$ is an integer, the output of each fourth active storage element providing an off output signal if said storage element is in its unselected state and an on signal if said storage element is in its selected state, each of said outputs connected to at least one second control input of a second group of said third user re-programmable interconnect elements, said first group and said second group chosen such that each of said user re-programmable interconnect elements is connected to an output from one of said third and one of said fourth active storage elements;

control-signal generating means, in each of said third user re-programmable interconnect elements, for generating said control signal to place it in its on state in response to the presence of an output signals from the third and fourth active storage elements to which it is connected; and wherein $M_1+M_2<N$.

12. The user re-programmable interconnect architecture of claim 11 wherein said active storage elements comprise SRAM cells, said user re-programmable interconnect elements comprise MOS transistors, and each of said control-signal generating means comprises an ANDing circuit.

13. A user re-programmable interconnect architecture disposed on a microcircuit substrate comprising:

a plurality of I/O structures arranged in a matrix of rows and columns, each of said I/O structures comprising an I/O pad, a first input/output pad conductor extending in a first direction from said input output pad and a second input/output pad conductor extending in a second direction from said input/output pad, said second direction substantially different from said first direction;

a row group of first interconnect conductors in each row of said array, each of said first interconnect conductors in each row group insulated from and intersecting said first input/output pad conductors of each of said I/O structures in their row;

a column group of second interconnect conductors in each column of said array, each of said second interconnect conductors in each column group insulated from and intersecting said second input/output pad conductors of each of said I/O structures in their column, said second interconnect conductors insulated from and forming intersections with said first interconnect conductors in each row group thereof;

a plurality of first user re-programmable interconnect elements, one of said first user re-programmable interconnect elements connected between each of said first interconnect conductors and said first input/output pad conductors at intersections thereof, each of said first user re-programmable interconnect elements being switchable between an on state and an off state in response to the state of a control signal;

a first plurality of active storage elements, each one of said first plurality of active storage elements having a first unselected state and a second selected state and providing said control signal to a different one of said plurality of first user re-programmable interconnect elements in response to its state;

a plurality of second user re-programmable interconnect elements, one of said second user re-programmable interconnect elements connected between each of said second interconnect conductors and said second input/output pad conductors at intersections thereof, each of said second user re-programmable interconnect elements being switchable between an on state and an off state in response to the state of a control signal;

a second plurality of active storage elements, each one of said second plurality of active storage elements having a first unselected state and a second selected state and providing said control signal to a different one of said plurality of second user re-programmable interconnect elements in response to its state;

N third user re-programmable interconnect elements associated with each intersecting row group and column group of interconnect conductors in each I/O structure, where N is an integer, one of said third user re-programmable interconnect elements connected at selected ones of said intersections between said first and second interconnect conductors, each of said third user re-programmable interconnect elements being switchable between an on state and an off state in response to the state of a control signal;

$M_1$ third active storage elements associated with each intersecting row group and column group of interconnect conductors in each I/O structure, each having an output and having a first unselected state and a second selected state, where $M_1$ is an integer, the output of each third active storage element providing an off output signal if said storage element is in its unselected state and an on signal if said storage element is in its selected state, each of said outputs connected to at least one first control input of each of a first group of said third user re-programmable interconnect elements in its I/O structure;

$M_2$ fourth active storage elements associated with each intersecting row group and column group of interconnect conductors in each I/O structure, each having an output and a first unselected state and a second selected state, where $M_2$ is an integer, the output of each fourth active storage element providing an off output signal if said storage element is in its unselected state and an on signal if said storage element is in its selected state, each of said outputs connected to at least one second control input of a second group of said third user re-programmable interconnect elements in its I/O structure, said first group and said second group chosen such that each of said user re-programmable interconnect elements is connected to an output from one of said third and one of said fourth active storage elements;

control-signal generating means, in each of said third user re-programmable interconnect elements, for generating said control signal to place it in its on state in response to the presence of on output signals from the third and fourth active storage elements to which it is connected; and wherein $M_1 + M_2 < N$.

14. The user re-programmable interconnect architecture of claim 13 wherein said active storage elements comprise SRAM cells, said user re-programmable interconnect elements comprise MOS transistors, and each of said control-signal generating means comprises an ANDing circuit.

* * * * *

UNITED STATES PATENT AND TRADEMARK OFFICE
CERTIFICATE OF CORRECTION

PATENT NO. : 5,319,261
DATED : June 7, 1994
INVENTOR(S) : Adi Srinivasan, Hong Cai, Ta-Pen Guo It is certified that error appears in the above-indentified patent and that said Letters Patent is hereby corrected as shown below:

On column 4, line 22, replace "element,." with —element,—.
Col. 6, line 25, "and" should read --an--.
On column 7, line 9, replace "x" with —X—.
On column 9, line 5, replace "x" with —X—.
In the drawings, Sheet 3, Fig. 4 should appear as follows:

3/9

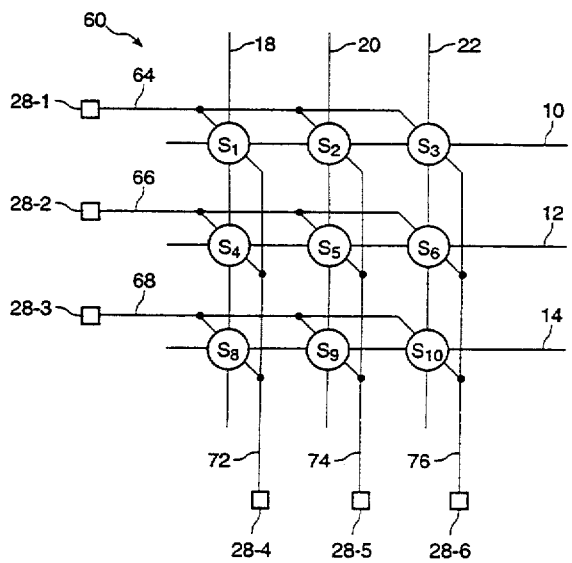

FIG. 4

UNITED STATES PATENT AND TRADEMARK OFFICE
CERTIFICATE OF CORRECTION

PATENT NO. : 5,319,261
DATED : June 7, 1994
INVENTOR(S) : Adi Srinivasan, Hong Cai, Ta-Pen Guo Page 2 of 3

It is certified that error appears in the above-indentified patent and that said Letters Patent is hereby corrected as shown below:

In the drawings, Sheet 4, Fig. 6 should appear as follows:

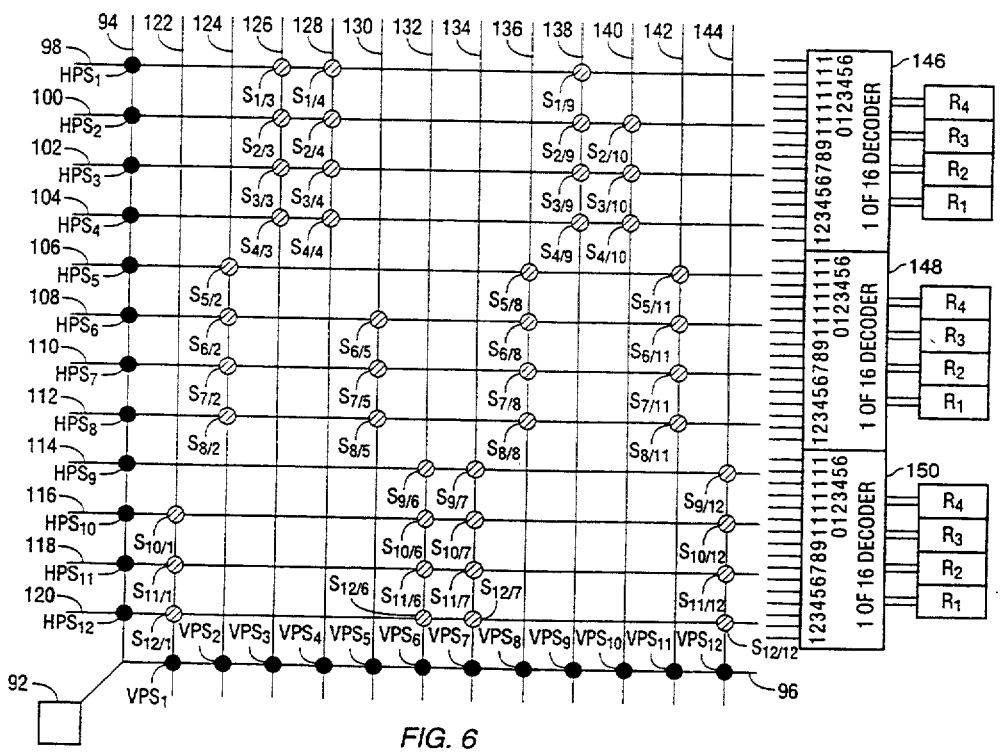

FIG. 6

UNITED STATES PATENT AND TRADEMARK OFFICE
CERTIFICATE OF CORRECTION

PATENT NO. : 5,319,261                                  Page 3 of 3
DATED      : June 7, 1994
INVENTOR(S): Adi Srinivasan, Hong Cai, Ta-Pen Guo It is certified that error appears in the above-indentified patent and that said Letters Patent is hereby corrected as shown below:

In the drawings, Sheet 5, Fig. 7A should appear as follows:

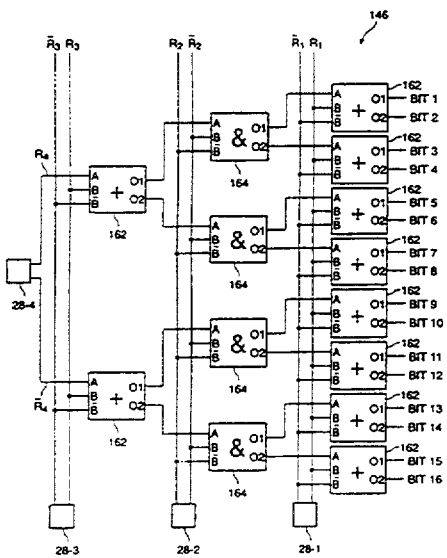

FIG. 7A

Signed and Sealed this

Eighth Day of November, 1994

Attest:

BRUCE LEHMAN

Attesting Officer            Commissioner of Patents and Trademarks